(12) United States Patent
Siemieniec et al.

(10) Patent No.: US 8,884,360 B2
(45) Date of Patent: Nov. 11, 2014

(54) SEMICONDUCTOR DEVICE WITH IMPROVED ROBUSTNESS

(75) Inventors: Ralf Siemieniec, Villach (AT); Oliver Blank, Villach (AT); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 16 days.

(21) Appl. No.: 13/404,161

(22) Filed: Feb. 24, 2012

(65) Prior Publication Data
US 2013/0221427 A1 Aug. 29, 2013

(51) Int. Cl.
*H01L 29/78* (2006.01)

(52) U.S. Cl.
USPC ............................ 257/328; 257/329; 257/330

(58) Field of Classification Search
USPC .................................................. 257/328–330
See application file for complete search history.

(56) References Cited

U.S. PATENT DOCUMENTS

| | | | | |
|---|---|---|---|---|
| 8,384,151 | B2 * | 2/2013 | Pfirsch | 257/328 |
| 2011/0018005 | A1 * | 1/2011 | Nakano | 257/77 |
| 2012/0043602 | A1 * | 2/2012 | Zeng et al. | 257/330 |
| 2012/0049270 | A1 * | 3/2012 | Hirler et al. | 257/328 |

FOREIGN PATENT DOCUMENTS

DE 102006011283 B3 9/2007

* cited by examiner

*Primary Examiner* — Howard Weiss
*Assistant Examiner* — Tifney Skyles
(74) *Attorney, Agent, or Firm* — Murphy, Bilak & Homiller, PLLC

(57) ABSTRACT

A semiconductor device includes a first contact in low Ohmic contact with a source region of the device and a first portion of a body region of the device formed in an active area of the device, and a second contact in low Ohmic contact with a second portion of the body region formed in a peripheral area of the device. The minimum width of the second contact at a first surface of the device is larger than the minimum width of the first contact at the first surface so that maximum current density during commutating the semiconductor device is reduced and thus the risk of device damage during hard commutating is also reduced.

22 Claims, 7 Drawing Sheets

US 8,884,360 B2

SEMICONDUCTOR DEVICE WITH IMPROVED ROBUSTNESS

TECHNICAL FIELD

Embodiments of the present invention relate to semiconductor devices having mesa contacts, in particular to field-effect semiconductor transistors having electrical contacts next to a vertical trench including a field electrode and a gate electrode, and to related methods for producing semiconductor transistors having mesa contacts.

BACKGROUND

Semiconductor transistors, in particular field-effect controlled switching devices such as a Metal Oxide Semiconductor Field-Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance, which is in the following also referred to as on-resistance $R_{on}$, and high voltage blocking capability are often desired. Due to structural efficiency and low on-resistance $R_{on}$, vertical trench MOSFETs are widely used, in particular in power applications. The breakdown voltage of a trench MOSFET may be raised by optimizing the shape and depth of the vertical trench and in particular by arranging an insulated field electrode in the vertical trench below the insulated gate electrode. The field electrode is typically connected to source potential and insulated form drain potential by a field oxide. Accordingly, charges in the drift region between two vertical trenches are at least partially compensated during blocking mode and thus the blocking capability improved.

To avoid reducing of break-down field strength in a peripheral area surrounding an active area with active MOSFET-cells and IGBT-cells, respectively, edge-termination structures may be provided in the peripheral area reducing the electric field in lateral direction during blocking mode. However, high current densities may occur at the outermost active cell during hard commutating and switching conditions, respectively, of for example more than about $10^{10}$ V/s. This may result in failure of the semiconductor device.

Accordingly, there is a need to provide semiconductor transistors which have a higher dynamic robustness, i.e. which are more robust during commutating.

SUMMARY

According to an embodiment of a semiconductor device, the semiconductor device includes a semiconductor body with a first surface defining a vertical direction. The semiconductor body includes a drift region of a first conductivity type arranged below the first surface and having a first maximum doping concentration, and a semiconductor layer of the first conductivity type having a second maximum doping concentration which is lower than the first maximum doping concentration, adjoining the drift region and being arranged below the drift region. The semiconductor body further includes in a vertical cross-section: a first body region of a second conductivity type adjoining the drift region; a source region of the first conductivity type adjoining the first body region and being arranged between the first surface and the first body region; a vertical trench including an insulated gate electrode and extending from the first surface at least to the semiconductor layer, adjoining the source region, the first body region and the drift region; a first contact having at the first surface a first minimum width and being in low Ohmic contact with the source region and the first body region; a second body region of the second conductivity type which forms a pn-junction only with the drift region; and a second contact in low Ohmic contact with the second body region and having at the first surface a second minimum width which is larger than the first minimum width.

According to an embodiment of a MOSFET, the MOSFET includes a semiconductor body having a first surface defining a vertical direction, a body region, and a drift region forming a pn-junction with the body region. The semiconductor body further includes in a vertical cross-section: an active area having a source region extending to the first surface and forming a further pn-junction with a first portion of the body region; a first vertical trench which extends from the first surface at least into the drift region, adjoins the first portion of the body region and includes an insulated gate electrode; and a first contact having at the first surface a first minimum width and being in low Ohmic contact with the source region and the first portion of the body region. The semiconductor body further includes in the vertical cross-section: a peripheral area having a second portion of the body region which extends to the first surface; a second vertical trench which extends from the first surface into the drift region, adjoins the second portion of the body region and includes an insulated field electrode; and a second contact in low Ohmic contact with the second portion of the body region and having at the first surface a second minimum width which is larger than the first minimum width. In the vertical cross-section, a third vertical trench extends from the first surface into the drift region, adjoins the first portion of the body region and the second portion of the body region, and includes an insulated gate electrode.

According to an embodiment of a method for producing a semiconductor device, the method includes: providing a semiconductor body including a drift region of a first conductivity type extending to a first surface and defining a vertical direction; defining an active area and a peripheral area; forming vertical trenches extending from the first surface at least into the drift region so that in the active area a first vertical trench is formed, in the peripheral area a second vertical trench is formed which surrounds the active area when seen from above, and a third vertical trench is formed between the first vertical trench and the second vertical trench; forming an insulated field electrode at least in the second vertical trench; forming an insulated gate electrode in the first vertical trench and the third vertical trench; implanting dopants from the first surface to form a body region of a second conductivity type in the drift region; implanting dopants from the first surface using a mask to form in the active area a source layer of the first conductivity type in an uppermost part of the body region; and forming contacts so that in a vertical cross-section a first contact having at the first surface a first minimum width is formed in low Ohmic contact with the source layer and a first portion of the body region, and a second contact is formed in low Ohmic contact with a second portion of the body region and having at the first surface a second minimum width which is larger than the first minimum width.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
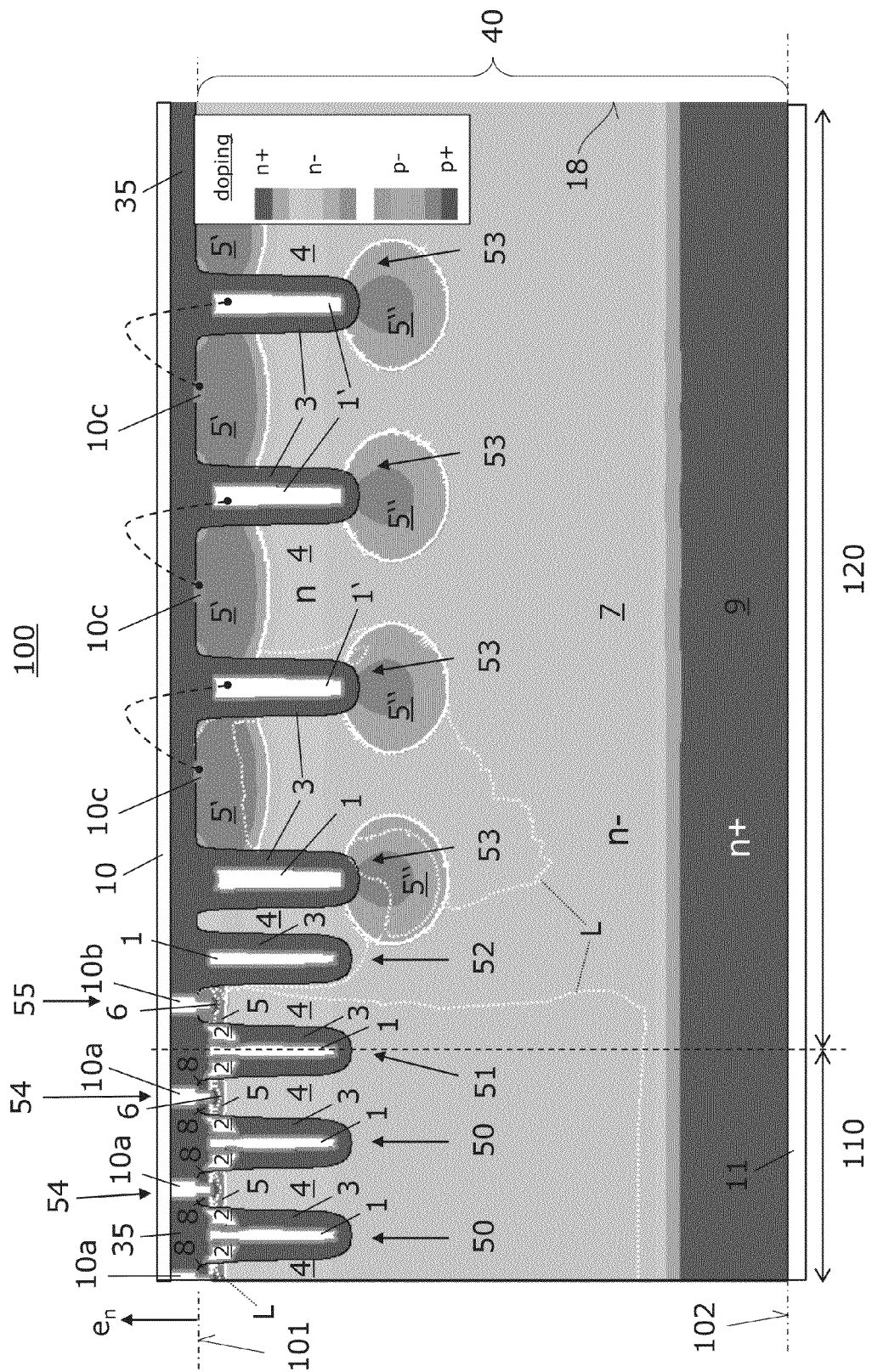
FIG. 1 illustrates a vertical cross-section through semiconductor devices according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor transistor devices or components, in particular to field effect transistor and manufacturing methods therefor. Within this specification the terms "semiconductor device" and "semiconductor component" are used synonymously. The formed semiconductor device is typically a vertical semiconductor device such as a vertical MOSFET with an insulated gate electrode arranged in a vertical trench and an insulated field electrode arranged in the vertical trench and typically extending vertically below the insulated field electrode. Typically, the formed semiconductor device is a power semiconductor device having an active area for carrying and/or controlling a load current and a peripheral area.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode. Within this specification the terms "in low resistive electric contact", and "in Ohmic contact" are used synonymously.

In the context of the present specification, the term "gate electrode" intends to describe an electrode which is situated next to, and insulated from the body region and configured to form and/or control a channel region.

In the context of the present specification, the terms "field plate" and "field electrode" intend to describe an electrode which is arranged next to a semiconductor region, typically the drift region, insulated from the semiconductor region, and configured to expand a depleted portion in the semiconductor region by applying an appropriate voltage, typically a negative voltage for an n-type drift region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a bipolar semiconductor device from the forward direction or conducting direction in which a pn-load junction, for example the pn-junction between the body region and the drift region of a MOSFET, is forwardly biased to the opposite direction or reverse direction in which the pn-load junction is reversely biased. The term "hard commutating" as used in this specification intends to describe commutating with a rise of the reverse voltage at the device of at least about $10^{10}$ V/s, more typically with a speed of at least about $2*10^{10}$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

With reference to FIG. 1, a first embodiment of a semiconductor device 100 is explained. FIG. 1 illustrates a vertical cross-section through a right portion of the semiconductor device 100. The semiconductor device 100 includes a semiconductor body 40 extending between a first surface 101 defining a vertical direction and a second surface 102 arranged opposite to the first surface 101. On the first surface 101 a first metallization 10, typically forming a source metallization, is arranged. On the second surface 102 a second metallization 11, typically forming a drain metallization, is arranged. Furthermore, a third metallization (not shown in FIG. 1), typically forming a gate metallization, is typically arranged on the first surface 101 and insulated from the first metallization 10. Accordingly, the semiconductor device 100 may be operated as a three-terminal device.

The semiconductor body 40 can be a single bulk monocrystalline material. It is also possible that the semiconductor body 40 includes a bulk mono-crystalline material 9 and at least one epitaxial layer 7, 4 formed on the bulk mono-crystalline material 9. Using the epitaxial layer(s) 7, 4 provides more freedom in tailoring the background doping of the material since the doping concentration can be adjusted during deposition of the epitaxial layer or layers.

In the exemplary embodiment illustrated in FIG. 1, the semiconductor body 40 includes an $n^+$-type semiconductor layer 9 extending to the second surface 102 and typically forming a drain contact layer, an $n^-$-type semiconductor layer 7 arranged on semiconductor layer 9 and an n-type drift layer or drift region 4 arranged on semiconductor layer 7.

The semiconductor device 100 is typically a power semiconductor device. Accordingly, the semiconductor device 100 typically includes a peripheral area 120 completely or at least partially surrounding an active area 110 having a plurality of active cells for controlling and/or switching a load current between the first metallization 10 and the second metallization 11. For sake of clarity only a right portion of the active area 110 is illustrated in FIG. 1.

In the active area 110 a p-type body region 5 is arranged in and forms a pn-junction with the drift region 4. The pn-junction between the drift region 4 and the body region 5 forms the body-diode. Forward current direction of the semiconductor device 100 corresponds to a forward biased body diode. The blocking mode of the semiconductor device 100 corresponds to a reverse biased body-diode. In the blocking mode, a space charge region extends from the pn-junction of the body-diode into the drift region 4 and semiconductor layer 7 and to a lesser extent into the body region 5. This is indicated by the dotted lines labeled 'L' in FIG. 1 for the active area 110. Note that the dotted lines 'L' correspond to regions of same electron and hole concentration and were obtained numerically for commutating the semiconductor device 100. The dotted lines 'L' shown in the active area 110 and notably in the body region 5 may, depending on reverse voltage, substantially correspond to the boundary of the space charge region formed during the blocking mode. However, in the peripheral area 120 the dotted lines 'L' deviate from the boundary of the space charge region of the static blocking mode. This is due to the high current density during hard commutating. Semiconductor layer 7 typically forms an electric field reducing semiconductor layer during the blocking mode and commutating, respectively.

Furthermore, an $n^+$-type source layer 8 extending to the first surface 101 and forming a further pn-junction with the body region 5 is formed in the active area 110. The body region 5 and the drift region 3 are spaced apart from the first surface 101 in the active area 110.

In the exemplary embodiment illustrated in FIG. 1, insulated vertical trenches 50, 51 including field electrodes 1 and gate electrodes 2 extend from the first surface 101 partially into semiconductor layer 7. Accordingly, the semiconductor device 100 may be operated as an n-channel MOSFET. The doping relations may be reversed. The field electrodes 1 are typically in low Ohmic contact with the source metallization 10 to provide charges to compensate fixed charges of the space charge region formed in the drift region 4 during the blocking mode. For sake of clarity, a field dielectric region arranged between the field electrode 1 and the drift region 4 and semiconductor layer 7, respectively, a gate dielectric region arranged between the gate electrode 2 and the semiconductor body 40 and an inter-electrode dielectric region arranged between the gate electrodes 2 and the field electrode 1 of the vertical trenches 50, 51 are shown as one insulating region 3. In addition, an interlayer dielectric region 35 is arranged on the first surface 101 and between the semiconductor body 40 and the first metallization 10.

Semiconductor layer 7 is optional. Accordingly, the insulated vertical trenches 50, 51 extend at least into the drift region 4. Providing optional semiconductor layer 7 having a lower maximum doping concentration than the drift region 4 allows for increasing the blocking-capability for a given structure of the drift region 4, field electrodes 1, gate electrodes 2 and insulating region 3 respectively.

Typically a plurality of insulated vertical trenches 50, which are the following also referred to as first vertical trenches, are formed in the active area 110. Between the first vertical trenches 50 and between the rightmost first vertical trench 50 and insulated vertical trench 51, in the following also referred to a third vertical trench 51, active mesa regions for carrying a load current of the semiconductor device 100 are formed. The third vertical trench 51 is arranged in a border region between the active area 110 and the peripheral area 120. The third vertical trench 51 and the first vertical trenches 50 are in the following also referred to as vertical trench 51 and further vertical trenches 50, respectively.

Due to the first vertical trenches 50 and the second vertical trench 51, the body region 5 and the source layer 8 have several portions or sub-regions in the vertical cross-section. In other words, the active area 11 includes, in the vertical cross-section, source regions 8 extending to the first surface 101 and forming pn-junctions with respective first portions of the body region 5.

According to an embodiment, there is no source region formed in a second portion of the body region 5 formed in the peripheral area 120 right of and next to the third vertical trench 51. Accordingly, an inactive mesa adjoins the third vertical trench 51. The term "active mesa" as used in this specification describes a semiconductor mesa between vertical trenches with a transistor structure through which a substantially unipolar current may flow when a channel region is formed across the two pn-junctions of the transistor-structure due to the field-effect. The term "inactive mesa" as used in this specification describes a rectifying semiconductor mesa between vertical trenches without a transistor structure. Accordingly, only a bipolar current may flow through the inactive mesa. Thus, the inactive mesa may contribute to a forward current through the semiconductor device; however to a lesser extend compared to active mesas.

Typically, the second portion of the body region 5 extends to the first surface 101. To ensure the same blocking capability of inactive mesa and active mesas, maximum horizontal extensions of the first and second portions of the body region 5 in the shown vertical cross-section substantially match.

According to an embodiment, the third vertical trench 51 is arranged between and adjoins the active mesa in the active area 110 and the inactive mesa in the peripheral area 120. In other words, the first vertical trench 51 adjoins, in the vertical cross-section, the source region 8, the first portion of body region 5 and the drift region 4 on one side and the second portion of body region 5 and the drift region 4 on the other side.

Due to the missing source region in the inactive mesa, latch-up is avoided. In the following the first portion of the body region 5 and the second portion of the body region 5 are also referred to as first body region and second body region, respectively. Portions of the body region 5 which are separated from each other in the shown cross-section may also be connected. The same applies to shown portions of the drift region 4.

Typically, several edge-termination structures are arranged in the peripheral area 120. In the exemplary embodiment, a circumferential trench 52 surrounding the active area 110 when seen from above and including an insulated field electrode 1 in low ohmic contact with the first metallization 10 extends from the first surface 101 at least to semiconductor layer 7. In the illustrated vertical-cross, the circumferential trench 52 forms a second vertical trench 52 which adjoins the second portion of the body region 5 and inactive mesa, respectively.

In addition, further edge-terminations structures are formed in the peripheral area 120. Several further or fourth vertical trenches 53 extend from the first surface 101 at least to the semiconductor layer 7. The fourth vertical trenches 53 are typically also circumferential trenches and include a field electrode 1' which is however only insulated from semiconductor layer 7 and the drift region 4 but in low ohmic contact with one respective neighbouring p-type semiconductor region 5' via respective contact metallizations 10c as indicated by dashed lines. Accordingly, the voltage is reduced in sufficiently small voltage steps between the field electrodes 1' towards an outer edge 18 during the blocking mode of the semiconductor device 100. In the exemplary embodiment shown in FIG. 1, four fourth vertical trenches 53 are shown. However, this is only an example. The number of fourth vertical trenches 53 may be smaller or higher. Typically, the number of fourth vertical trenches 53 will be higher for a device with a higher designed blocking capability.

In other words, the peripheral area 120 includes a trench field electrode 1' which is in low ohmic contact with the neighbouring p-type semiconductor region 5' and which is, in the vertical cross-section, separated from the semiconductor body 40 by a dielectric region 3.

Furthermore, floating p-type semiconductor regions 5" are arranged in semiconductor layer 7 below and adjoining the fourth vertical trenches 53 to protect bottom portions of the adjoining fourth vertical trenches 53 during the blocking mode.

According to an embodiment, first contacts 10a in low Ohmic contact with the source regions 8 and the first portions of the body region 5 are formed in the active area 110 and a second contact 10b in low Ohmic contact with the second portion of the body region 5 is formed in the peripheral area 120. The minimum width of the second contact 10b at the first surface 101 is larger than the minimum width of the first contact 10a at the first surface 101. Accordingly, maximum current density during commutating the semiconductor device 100 may be reduced and thus risk of device damage during hard commutating is also reduced. This is explained in more detail below with regard to FIG. 3.

In the exemplary embodiment illustrated in FIG. 1, the first contact 10a and the second contact 10b are formed as shallow trench contacts. Alternatively, the contacts 10a, 10b are formed at the first surface 101. The contacts 10a, 10b may for example be formed by highly doped poly-silicon plugs 10a, 10b arranged in first and second shallow trenches 54, 55 and extending from the first metallization 10 below the first surface 101. In other embodiments, at least one of the first contact 10a and the second contact 10b are formed as surface contacts extending between the first surface 101 and the first metallization 10. Alternatively, the contacts 10a and 10b may also be formed by a metal plug, a silicide, a metal nitride or a stack using one or more of the materials mentioned before.

In order to ensure a low ohmic contact between the contacts 10a, 10b and the first and second portion of the body region 5, a first body contact region 6 having a higher maximum doping concentration than the first portion of body region 5 is arranged between the first portion of the body region 5 and the first shallow trench contact 10a, and a second body contact region 6 having a higher maximum doping concentration than the second portion of the body region 5 is typically arranged between the second portion of the body region 5 and the second shallow trench contact 10b.

Typically, the maximum doping concentration of the second body contact region 6 exceeds the maximum doping concentration of the first body contact region 6. In so doing, a temperature increase due to a high current density close to the second contact 10 during the blocking mode may be reduced and thus the life-time of the semiconductor device 100 increased.

Referring to FIGS. 2A to 2C, embodiments of MOSFET-cells 100a to 100c that may be used in the active area 110 of the semiconductor device 100 are explained. FIGS. 2A to 2C illustrate vertical cross-section through half of unity cells between the first surface 101 and the second surface 101. Accordingly, only half of respective first vertical trench 50 and the adjoining active mesa are shown. Structural features, which are similar to structural features described above, are denoted by the same reference numerals. Furthermore, the description of similar features is omitted.

FIG. 2A illustrates a MOSFET-cell 100a with a first vertical trench 50 which extends from the first surface 101 partly into semiconductor layer 7. Semiconductor layer 7 is however only optional as indicated by the dashed line between semiconductor layer 7 and drift region 4. The first vertical trench 50 includes a field electrode 1 and two gate electrodes 2 which are, in the vertical cross-section, separated form each other. However, only one of the two gate electrodes 2 is illustrated in FIG. 2A. The field electrode 1 is arranged symmetrical with respect to a central vertical axis (left dashed vertical line) of the first vertical trench 50. Furthermore, the field electrode 1 extends vertically below an interface between the drift region 4 and semiconductor layer 7 to provide counter charges along the drift region 4 during the blocking mode.

Figure 2:
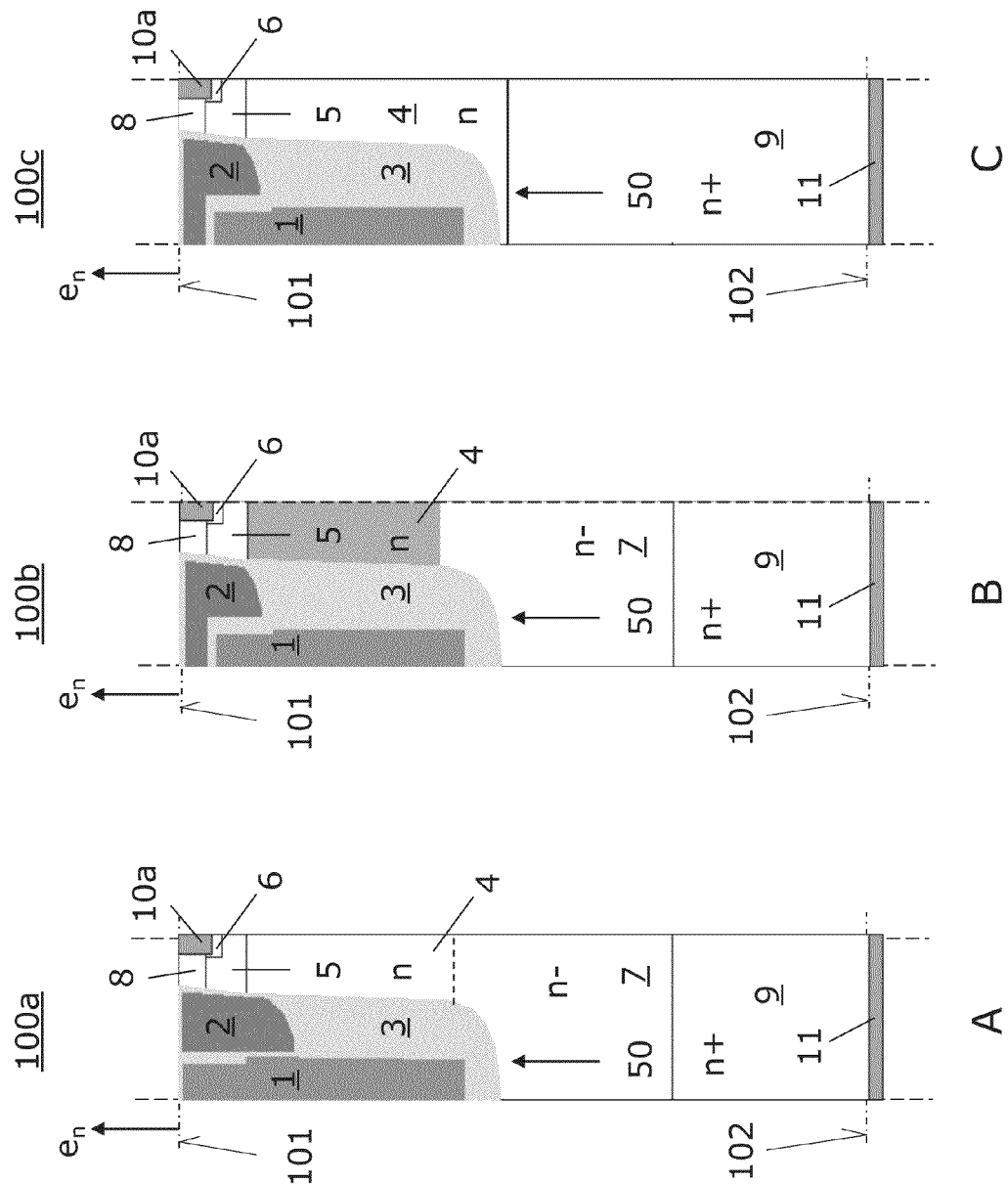
FIGS. 2A to 2C illustrate vertical cross-sections through a semiconductor device according to embodiments.

MOSFET-cell 100b illustrated in FIG. 2B is similar to MOSFET-cell 100a. However, only one continuous gate electrode 2 is arranged mirror-symmetrically on the field electrode 1. MOSFET-cell 100c illustrated in FIG. 2C is similar to MOSFET-cell 100b. However, semiconductor layer 7 is omitted and the drift region 4 extends to the drain layer 9. Additionally, a field-stop region having a higher maximum doping concentration than the drift region 4 and semiconductor layer 7, respectively, may be provided on the drain layer 9. MOSFET 100c as shown in FIG. 2C of course may also have two separated gate electrodes as MOSFET 100a shown in FIG. 2A. The structure of the gate electrodes may differ along the trench 50. For example trench 50 may have, in a direction which is substantially orthogonal to the shown cross-sections of FIG. 2, two separated gate electrodes only close to trench ends and one continuous gate electrode between the trench ends.

Figure 3:
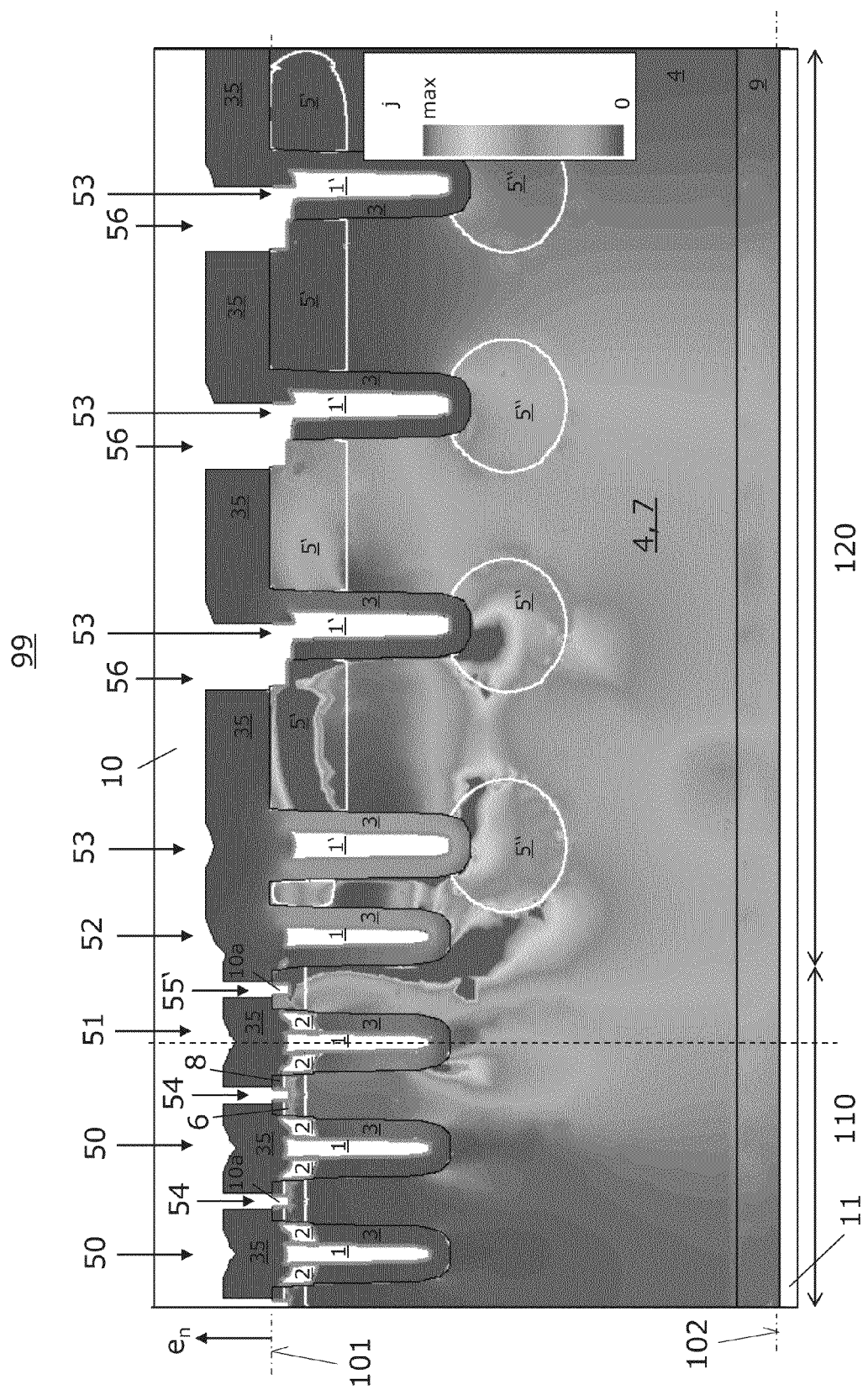
FIG. 3 illustrates in a vertical cross-section a current density of a semiconductor device during blocking mode.

FIG. 3 illustrates in a vertical cross-section a current density j of a MOSFET 99 during commutating. The MOSFET 99 is similar to the semiconductor device 100 explained above with regard to FIGS. 1 and 2. However, shallow trench contacts 10a, 10b of equal cross-sectional shape are formed in the active area 110 and the peripheral area 120. Accordingly, a shallow trench contact 10a of equal minimum horizontal extension is also formed in shallow trenches 55' to contact the inactive mesa arranged between the third vertical trench 51 and circumferential vertical trench 52 of MOSFET 99. During commutating, holes (positive charges) stored in semiconductor layer 7 and the drift region 4 of the peripheral area 120, respectively, are to be discharged next the first surface 101 as the source metallization 10 is on a lower potential than the drain metallization 11. This results in a high current density in the inactive mesa which is particularity high close to the shallow trench contact 10a contacting the inactive mesa.

In the semiconductor device 100 explained above with regard to FIGS. 1 and 2, the first minimum width of the shallow trench contact 10b contacting the inactive mesa at the first surface 101 and below the first surface 101 is larger compared to the shallow trench contacts 10a of the active area 110. Accordingly, the maximum current density during commutating is reduced in the inactive mesa. Thus, energy density and local heating of this region are reduced during commutating. Accordingly, the life-time of the semiconductor device 100 may be prolonged. Furthermore, the risk of device failure and avalanche breakdown, respectively, of the semiconductor device 100 during hard commutating is reduced. Consequently, the dynamic robustness during switching off and/or commutating is improved. These effects may be further amplified by providing a comparatively high doping concentration of the body contact region at and/or close to the second shallow trench contact 10b of the peripheral area 120.

Figure 4:
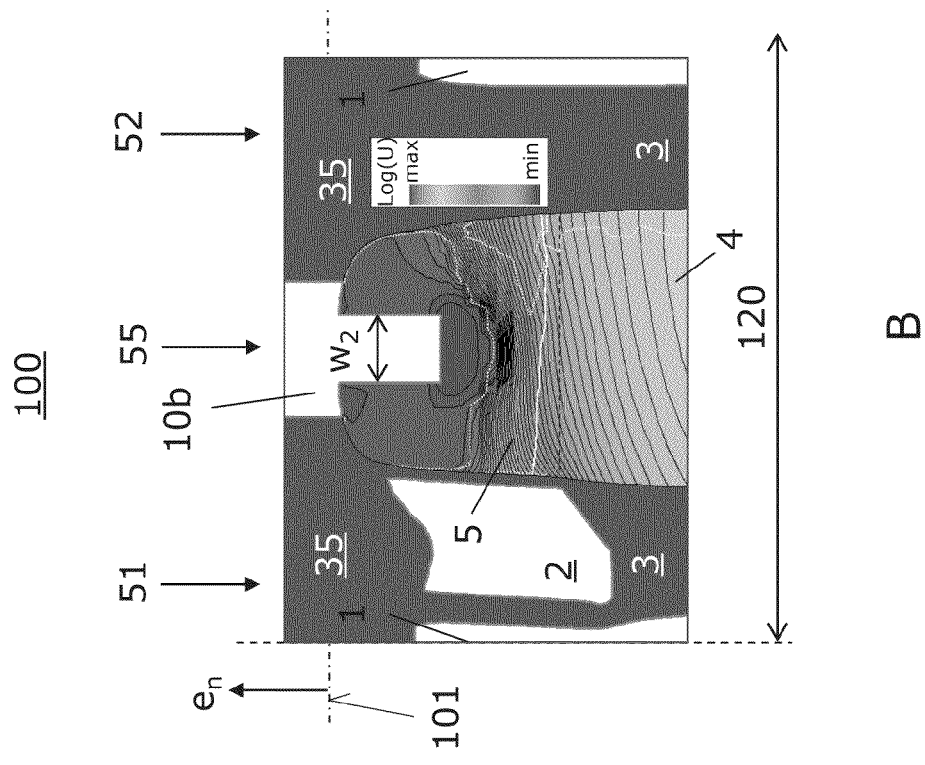
FIGS. 4A and 4B illustrate vertical cross-sections through a semiconductor device according to embodiments.
Figure 4:
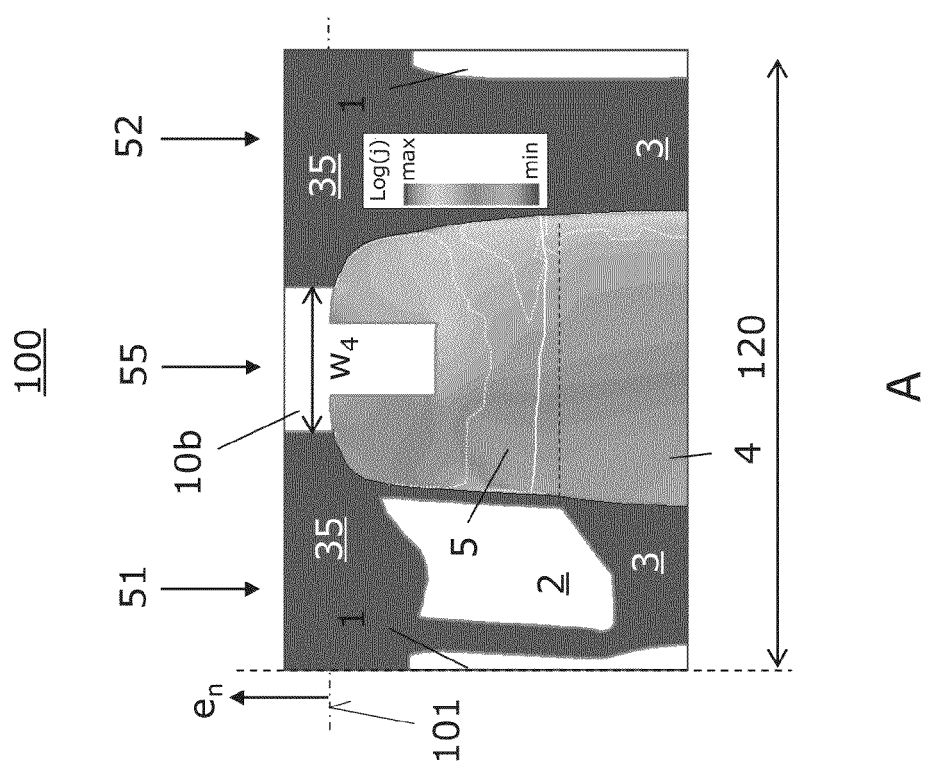

FIGS. 4A and 4B illustrate in vertical cross-sections a current density j and a voltage U, respectively, of an upper portion of the inactive mesa between the third vertical trench 51 and circumferential vertical trench 52 using a logarithmic scaling between the contour lines. As explained above with regard to FIGS. 1 and 2, there is no source region provided on the second portion of the body region 5 of the inactive mesa. Accordingly, the second portion of the body region 5 extends to the first surface 101.

In the exemplary embodiment, the second shallow trench contact 10b is substantially T-shaped in the vertical cross-section. Accordingly, the second shallow trench contact 10b has at and below the first surface 101 a second minimum width $w_2$, i.e. a second minimum horizontal extension, and above the first surface 101 a fourth minimum width $w_4$ which is larger than second minimum width $w_2$. However, this is only an example. Contacts 10b may have substantially equal widths $w_2=w_4$ or also may have a flat contact on top of the mesa where the contact does not extend into the semiconductor material.

The first shallow trench contact 10a is typically also substantially T-shaped in the vertical cross-section. Accordingly, the first shallow trench contact 10a has at and below the first surface 101 a first minimum width $w_1$ and above the first surface 101 a third minimum width $w_3$ which is larger than first minimum width $w_1$. However, this is only an example. Contacts 10a may have substantially equal widths $w_1=w_3$ or also may have a flat contact on top of the mesa where the contact does not extend into the semiconductor material.

According to an embodiment, the second minimum width $w_2$ is larger than the first minimum width $w_1$, typically by a factor of at least 1.2 or by a factor of at least 1.5. Accordingly, maximum current density j during commutating in the inactive mesa close to the second shallow trench contact 10b is significantly reduced as can be inferred from FIG. 4A.

Figure 5:
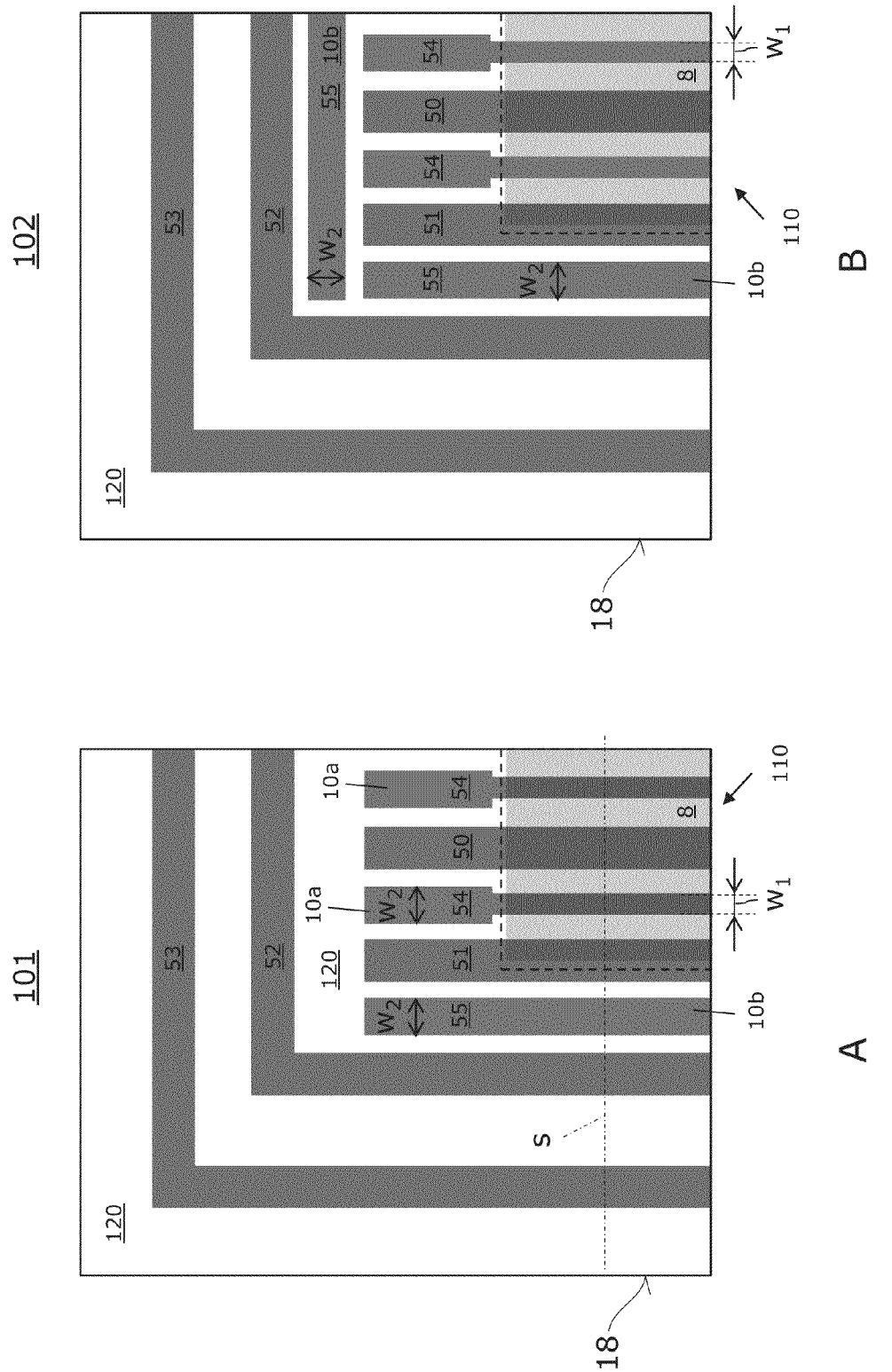
FIGS. 5A and 5B illustrate in plan views semiconductor devices according to embodiments.

FIGS. 5A and 5B illustrate respective semiconductor devices 101 and 102 in plan views on the first surface. The drawings of FIGS. 5A and 5B typically correspond to mask layouts for forming the source layer 8 in the active area 110, the first vertical trenches 50 extending from the active area 110 into the peripheral area 120, the third vertical trenches 51 formed in a boundary region between the active area 110 and the peripheral area 120, the first shallow trenches 54 extending from the active area 110 into the peripheral area 120, the second shallow trenches 55 arranged in the peripheral area 120, a second vertical trench 52 surrounding the active area 110 and one or more fourth vertical trenches 53 surrounding the active area 110. The second vertical trench 52 and the fourth vertical trench 53 are typically circumferential vertical trenches. As the vertical trenches 50 to 53 and the shallow trenches 54 and 55 are typically etched into the semiconductor body in the vertical direction, the mask layout typically also corresponds to the layout of the vertical trenches 50 to 53 and the shallow trenches 54, 55 and first and second shallow trench contacts 10a, 10b, respectively, in a horizontal cross-section through the semiconductor body close to the first surface. Above the first surface, the first and second contacts 10a, 10b can be formed as shallow trench contacts and can be wider as explained above with regard to FIGS. 4A, 4B. Masks 54 and or 55 may also correspond to etching masks for forming the first surface contacts 10a and the second surface contacts 10b, respectively.

The semiconductor device 101 illustrated in FIG. 5A is similar to the semiconductor device 100 illustrated in FIG. 1. However, only one fourth vertical trench 53 is illustrated in FIG. 5A. Typically, semiconductor device 101 also includes several fourth vertical trenches 53. Accordingly, a vertical cross-section along dashed-dotted line 'S' of FIG. 5A is typically similar to FIG. 1 mirrored at a vertical axis.

According to an embodiment, the first shallow trench contacts 10a are formed in shallow trenches 54 which have in the active area 110 a first maximum width which is substantially equal to the first minimum width $w_1$ and in the peripheral area 120 a second maximum width which is substantially equal to second minimum width $w_2$. Accordingly, stored holes can be discharged through a larger area during commutating the semiconductor device 101. Thus, maximum current density during commutating may be further reduced. Consequently, the dynamic robustness during switching off and/or commutating is improved.

The semiconductor device 102 illustrated in FIG. 5B is similar to the semiconductor device 101 illustrated in FIG. 5A. However, the second shallow trench contact 10b is formed in a shallow trench 55 which piece-wise surrounds the active area 110 when seen from above. Accordingly, maximum current density during commutating may be further reduced. Consequently, the dynamic robustness during switching off and/or commutating is improved.

Figure 6:
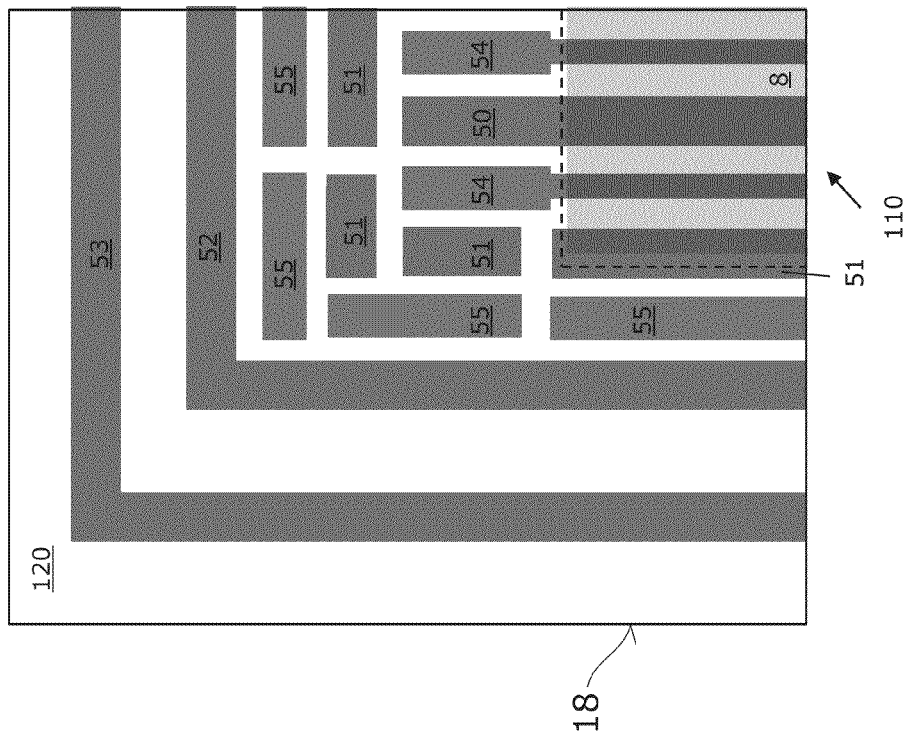
FIGS. 6A and 6B illustrate in plan views semiconductor devices according to embodiments.
Figure 6:
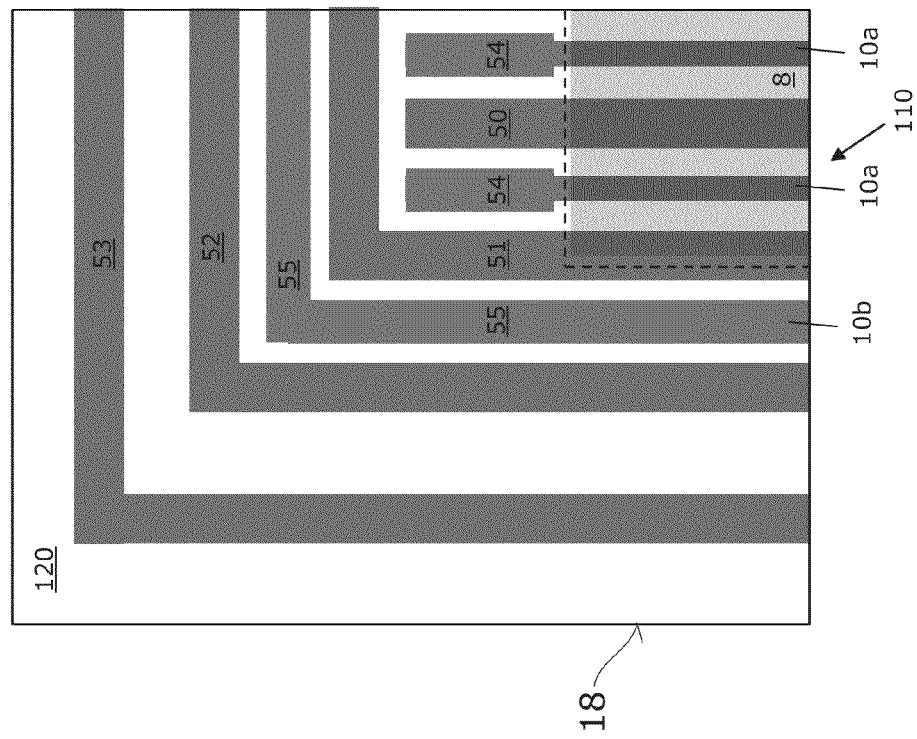

The second shallow trench contact 10b may also be formed in a shallow trench 55 which completely surrounds the active area 110 when seen from above as illustrated for the semiconductor device 103 in FIG. 6A showing a plan view. This also improves dynamic robustness during switching off and/or commutating.

Semiconductor device 104 illustrated in a plan view in FIGS. 6B is similar to the semiconductor device 103 illustrated in FIG. 6A. However, several third vertical trenches 51 are arranged around the active area 110 when seen from above instead of one continuous vertical trench 51.

Figure 7:
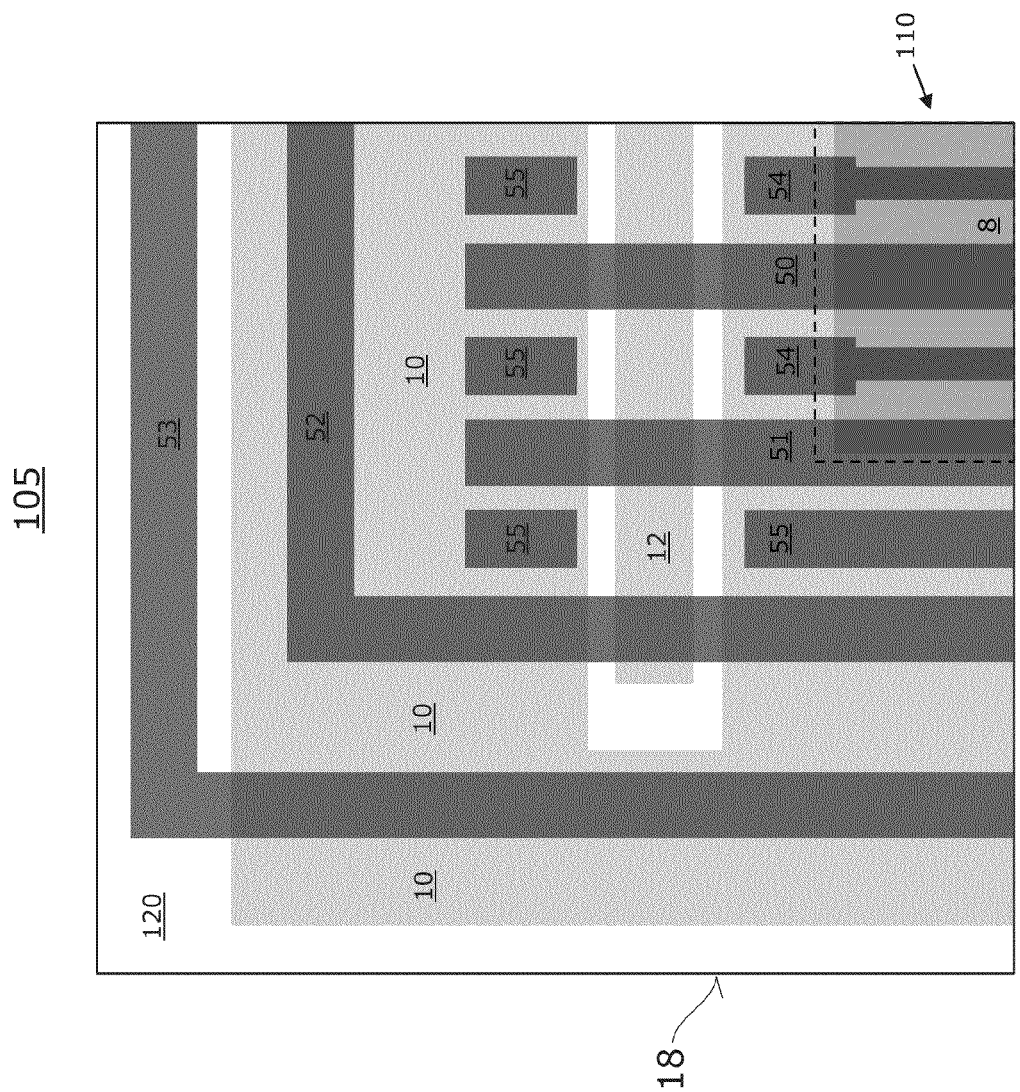
FIG. 7 illustrate in a plan view a semiconductor device according to an embodiment.

FIG. 7 illustrate in a plan view a semiconductor device 105 which is similar to the semiconductor devices 100 to 104. In addition, a typical layout of the source metallization 10 and gate metallization 12 is shown in FIG. 7.

Referring again to FIG. 1, methods for producing the semiconductor device 100 are explained. In a first process a semiconductor body 40 may be provided. The semiconductor body 40 includes a drift region 4 of a first conductivity type extending to the first surface 101 and a drain layer 9 extending to a second surface 102 arranged opposite the first surface 101. Thereafter, an active area 110 and a peripheral area 120 are defined.

Thereafter, vertical trenches extending from the first surface 101 at least into the drift region 4 may be formed so that in the active area 110 a first vertical trench 50 is formed, in the peripheral area 120 a second vertical trench 52 is formed which surrounds the active area 110 when seen from above, and a third vertical trench 51 is formed between the first vertical trench 50 and the second vertical trench 52.

The third vertical trench 51 is typically formed such that the third vertical trench 51 completely or piece-wise surrounds the active area 110. The second vertical trench 53 may also be formed such that the third vertical trench 53 at least piece-wise surrounds the active area 110.

Furthermore, at least one fourth vertical trench 53 is typically also formed in the peripheral area 120 during vertical trench formation. Floating semiconductor regions 5" of a second conductivity type are formed below the fourth vertical trench 53, for example by implantation and subsequent drive-in.

Typically, a semiconductor layer 7 of the first conductivity type is arranged between the drift region 4 and the drain layer 9. The drain region 4 has a first maximum doping concentration and the semiconductor layer 7 has a second maximum doping concentration which is lower than the first maximum doping concentration. In this embodiment, the first vertical trench 50, the second vertical trench 52, the third vertical trench 51 and the fourth vertical trench are typically etched from the first surface 101 through the drift region 4 and partially into the semiconductor layer 7.

Thereafter, insulated field electrodes 1, 1' are formed in the first, second, third and fourth vertical trenches 50, 51, 52, 53.

Thereafter, insulated gate electrodes 2 are typically formed in the first vertical trench 50 and the third vertical trench 51.

Thereafter, dopants are typically implanted from the first surface 101 to form a body region 5 of the second conductivity type in the drift region 4 of the active area 110 and in the peripheral area 120 and to form a semiconductor region 5' of the second conductivity type extending to the first surface 101 and between the fourth vertical trenches 53 to form further edge-termination structures in the peripheral area 120.

Thereafter, dopants are typically implanted from the first surface 101 through a mask to form in the active area 110 a source layer 8 and source regions, respectively, of the first conductivity type in first portions of the body region 5 and between the first portions of the body region 5 and the first surface 101.

Thereafter, an interlayer dielectric region 35 may be formed on the first surface 101, typically as an oxide or a layer stack comprising an oxide layer.

Thereafter, contacts are typically formed through the interlayer dielectric region 35 at least to the first surface 101 so that in the vertical cross-section a first contact 10a is formed in low Ohmic contact with the source layer 8 and the first portion of the body region 5 in the active area 110, and a second contact 10b is formed in low Ohmic contact with a second portion of the body region 5 in the peripheral area 120. At the first surface 101, the first contact 10a has a first minimum width and the second contact 10b has a second minimum width which is larger than the first minimum width.

Typically, forming contacts includes forming first shallow trench contacts 10a having in the vertical cross-section below the first surface 101 a minimum width which substantially matches the first minimum width, and forming a second shallow trench contact 10b having in the vertical cross-section below the first surface 101 a minimum width which substantially matches the second minimum width.

Forming contacts typically includes etching and depositing a conductive material such as highly doped poly-silicon, a metal silicide or a metal. Filling the contact may also comprise the forming of a barrier layer in the etched contact like a metal nitride.

Forming the shallow trench contacts 10a, 10b typically includes two etching processes, namely a first anisotropic etching through the interlayer dielectric region 35 and into the semiconductor body 40 to form the shallow trenches 54, 55 of different minimum width and a second isotropic oxide etching to widen the openings of the interlayer dielectric region 35.

Prior to depositing the conductive material, body contact regions 6 are typically formed below the first surface next to the shallow trenches 54, 55 by a further implantation of dopants and subsequent drive-in.

According to an embodiment, forming the body contact region 6 below the second shallow trench 55 includes at least one of a dual mode implantation and a quad mode implantation to increase conductivity of the body contact region 6 close to the second shallow trench 55 and the second shallow trench contact 10b, respectively.

Further, the semiconductor regions 5' of the second conductivity type are electrically connected to a neighboring insulated field electrode 1' arranged in a respective fourth vertical trench 53.

Furthermore, a source metallization 10 in electric contact with the shallow trench contacts 10a, 10b and the insulated field electrodes 1, and a gate metallization in electric contact with the insulated gate electrodes 2 are formed on the first surface 101.

Thereafter, a drain metallization 11 may be formed on the second surface 102 to from a three-terminal semiconductor device 100.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising a semiconductor body comprising:
    a first surface defining a vertical direction;
    a drift region of a first conductivity type comprising a first maximum doping concentration and being arranged below the first surface; and,
    a semiconductor layer of the first conductivity type comprising a second maximum doping concentration which is lower than the first maximum doping concentration, the semiconductor layer adjoining the drift region and being arranged below the drift region, the semiconductor body further comprising in a vertical cross-section:
    a first body region of a second conductivity type adjoining the drift region, a source region of the first conductivity type adjoining the first body region and being arranged between the first surface and the first body region;
    a vertical trench extending from the first surface at least to the semiconductor layer, adjoining the source region, the first body region and the drift region, and comprising an insulated gate electrode;
    a first contact comprising at the first surface a first minimum width and being in low Ohmic contact with the source region and the first body region;
    a second body region of the second conductivity type which forms a pn-junction only with the drift region; and,
    a second contact in low Ohmic contact with the second body region and comprising at the first surface a second minimum width which is larger than the first minimum width.

2. The semiconductor device of claim 1, wherein the first contact is formed as a shallow trench contact comprising below the first surface a minimum width substantially matching the first minimum width.

3. The semiconductor device of claim 1, wherein the second contact is formed as a shallow trench contact comprising below the first surface a minimum width substantially matching the second minimum width.

4. The semiconductor device of claim 1, wherein the second body region adjoins in the vertical cross-section the vertical trench, further comprising in the vertical cross-section a further vertical trench extending from the first surface at least to the semiconductor layer, adjoining the source region, the first the body region and the drift region, and comprising an insulated gate electrode.

5. The semiconductor device of claim 4, wherein at least one of the vertical trench and the further vertical trench comprises an insulated field-electrode.

6. The semiconductor device of claim 1, wherein the semiconductor body further comprises an active area and a peripheral area comprising a circumferential trench which extends from the first surface at least to the semiconductor layer and comprises an insulated field electrode surrounding the active area when seen from above, in the vertical cross-section the circumferential trench adjoining the second body region, and the first body region being arranged in the active area.

7. The semiconductor device of claim 6, further comprising in the peripheral area a semiconductor region of the second conductivity type and a neighboring trench field electrode which is in low ohmic contact with the semiconductor region and which is, in the vertical cross-section, separated from the semiconductor body by a dielectric region.

8. The semiconductor device of claim 1, wherein the second minimum width is at least 1.2 times larger than the first minimum width.

9. The semiconductor device of claim 1, wherein the second body region extends to the first surface.

10. A MOSFET, comprising a semiconductor body comprising:
- a first surface defining a vertical direction;
- a body region; and,
- a drift region forming a pn-junction with the body region, the semiconductor body further comprising in a vertical cross-section:
- an active area comprising a source region extending to the first surface and forming a further pn-junction with a first portion of the body region, a first vertical trench which extends from the first surface at least into the drift region, adjoins the first portion of the body region and comprises an insulated gate electrode, and a first contact in low Ohmic contact with the source region and the first portion of the body region, the first contact comprising at the first surface a first minimum width;
- a peripheral area comprising a second portion of the body region which extends to the first surface, a second vertical trench which extends from the first surface into the drift region, adjoins the second portion of the body region and comprises an insulated field electrode, and a second contact in low Ohmic contact with the second portion of the body region and comprising at the first surface a second minimum width which is larger than the first minimum width; and,
- a third vertical trench which extends from the first surface into the drift region, adjoins the first portion and the second portion of the body region, and comprises an insulated gate electrode.

11. The MOSFET of claim 10, wherein the first contact is formed as a shallow trench contact comprising below the first surface and in active area a minimum width substantially matching the first minimum width.

12. The MOSFET of claim 10, wherein the second contact is formed as a shallow trench contact comprising below the first surface a minimum width substantially matching the second minimum width.

13. The MOSFET of claim 10, wherein the peripheral area further comprises at least one additional edge-termination structure.

14. The MOSFET of claim 10, wherein a first body contact region comprising a higher maximum doping concentration than the first portion of the body region is arranged between the first portion of the body region and the first shallow trench contact, and wherein a second body contact region comprising a higher maximum doping concentration than the first body contact region is arranged between the second portion of the body region and the second shallow trench contact.

15. The MOSFET of claim 11, wherein the first shallow trench contact is formed in a shallow trench comprising in the active area a first maximum width which is substantially equal to the first minimum width and in the peripheral area a maximum width, measured in the same direction as the first maximum width, which is substantially equal to second minimum width.

16. The MOSFET of claim 12, wherein the second shallow trench contact is formed in a shallow trench at least piecewise surrounding the active area when seen from above.

17. The MOSFET of claim 10, comprising several third vertical trenches arranged around the active area when seen from above.

18. The MOSFET of claim 10, wherein the active area comprises in the vertical cross-section at least one of a plurality of first portions of the body region, a plurality of first vertical trenches, and a plurality of first contacts.

19. The MOSFET of claim 10, wherein the drift region is of a first conductivity type and comprises a first maximum doping concentration, further comprising a semiconductor layer of the first conductivity type comprising a second maximum doping concentration which is lower than the first maximum doping concentration, the semiconductor layer adjoining the drift region and being arranged below the drift region.

20. The MOSFET of claim 10, further comprising a source metallization arranged on the first surface and in contact with the first contact and the second contact.

21. The MOSFET of claim 10, wherein the second portion of the body region forms a pn-junction only with the drift region.

22. The MOSFET of claim 10, wherein the semiconductor body further comprises a second surface arranged opposite to the first surface and an outer edge extending between the first surface and the second surface, and wherein the peripheral area extends to the outer edge.

* * * * *